United States Patent [19]

Tsai

[11] Patent Number: 4,858,076
[45] Date of Patent: Aug. 15, 1989

[54] CONVERTER

[76] Inventor: Ming T. Tsai, No. 70, An Ping Rd., Tainan, Taiwan

[21] Appl. No.: 103,732

[22] Filed: Sep. 30, 1987

[51] Int. Cl.$^4$ ............................................. H05K 7/02
[52] U.S. Cl. .................................. 361/417; 361/394; 361/419; 361/420
[58] Field of Search ..................... 174/52 PE; 336/96; 357/72; 361/380, 392–395, 417, 419–420; 363/146

[56] References Cited

U.S. PATENT DOCUMENTS 2,683,767  7/1954  Cunningham ................. 174/52 PE
2,740,905  4/1956  Henderson ..................... 174/52 PE
4,039,900  8/1977  Roback et al. ....................... 363/146

Primary Examiner—A. D. Pellinen
Assistant Examiner—Gregory D. Thompson
Attorney, Agent, or Firm—Lowe, Price, Leblanc, Becker & Shur

[57] ABSTRACT

This invention relates to a converter and, in particular, to an improved converter including a cast bottom having an inserting groove, two connection cylinders, a trough stand, two ribs and an isolation trough, a cast top, a receptacle stand, a L-shaped fixing bracket a receptacle and a transformer. The trough stand of the cast bottom will prevent resin poured in to secure a transformer in place from flowing randomly, and confine it in the trough stand so that wires, connection cylinders, the fixing bracket and the receptacle stand will not be coated with or be adhered to by resin and so may be repaired or replaced easily. The direction of alignment of the receptacle may be changed so it may be readily connected with another connector.

1 Claim, 6 Drawing Sheets (PRIOR ART)

CONVERTER

BACKGROUND OF THE INVENTION

The prior art teaches pouring of a resin into a trough stand to secure a transformer. The resin when poured into a trough stand will tend to adhere to the transformer located therein and to wires connected thereto, the two connector cylinders and the receptacle in the trough stand, which makes it difficult to repair when the transformer is out of order. The receptacle of the prior art, moreover, is fixed and can not change its direction because the resin has adhered to the lower converter to connect the said prior art converter with other connector when space is not enough.

SUMMARY OF THE INVENTION

It is, therefore, an object of the present invention to provide an improved converter which has a trough stand in the cast bottom for the converter, e.g., a transformer. Four setting plates are provided in the inner bottom of the trough stand to hold the transformer firmly. The trough stand also confines resin in the trough stand and does not allow it to flow randomly, so that wires affixing bracket, connection cylinders and the receptacle stand are not coated with resin. A secondary object of the present invention is to provide a converter in which the direction of the receptacle may be changed as required when available space for adapting this receptacle to connect with other equipment is inadequate.

It is a primary object of the present invention to confine resin when poured into a converter trough stand without adhering it to other parts.

It is another object of the present invention to fix the transformer at a selected place in the trough stand with four setting plates.

It is still another object of the present invention to provide for change of the direction of the receptacle.

It is still another object of the present invention to provide an improved converter that can be easily repaired or replaced when it is out of order.

Other objects, merits and fuller understanding of the present invention will be obtained by those having ordinary skill in the art when the following detailed description of the preferred embodiment has been read in conjunction with the accompanying drawings.

DETAILED DESCRIPTION OF THE PREFERRED EMBODIMENT

Figure 1:
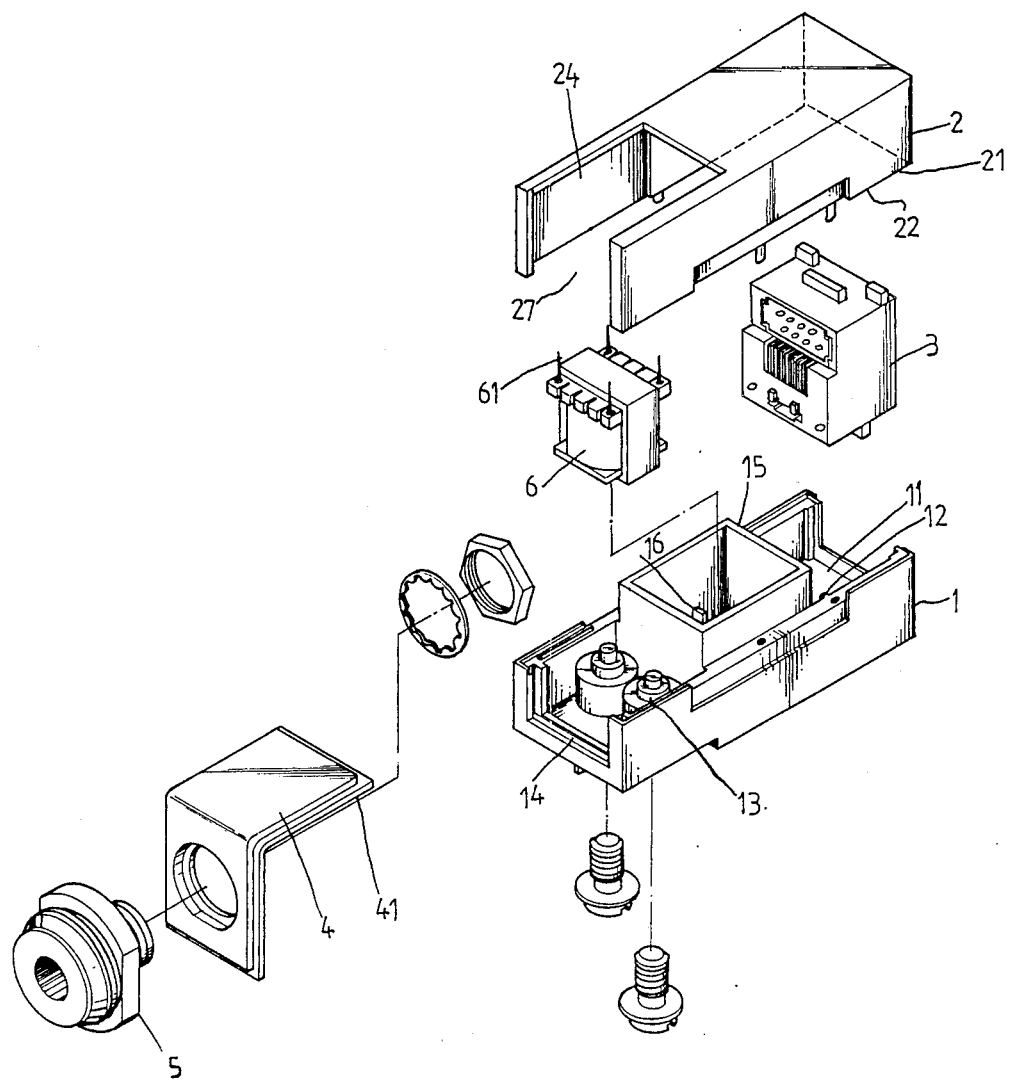
FIG. 1 is an exploded perspective view of a preferred embodiment of the present invention.

With reference to FIG. 1 showing an exploded perspective view of a preferred embodiment of the present invention. The invention includes a cast bottom 1, a cast top 2, a receptacle stand 3, a fixing bracket 4, a receptacle 5 and a transformer 6. The cast bottom 1 has an isolation trough 11 at one side for installing the receptacle stand and is partitioned by two ribs 12 from the trough stand 15. Trough stand 15 juts out from the center of the cast bottom 1 for installing thereat of the transformer 6, and four setting plates 16 (best seen in FIG. 2) at the inner bottom side of the trough stand 15 are provided to hold the transformer 6 tightly. Two connection cylinders 13 located at the other side are for outer connections, and an inserting groove 14 is located adjacent the outside of the two connection cylinders for insertion of a fixing bracket 4 thereat. The cast top 2 also has an isolation trough 21 at one side for covering the upper portion of the receptacle stand 3 which is installed in trough 11 of the cast bottom 1 and is partitioned by two ribs 22, and a U-shaped recess trough 27 which has a setting point 24 (see FIG. 2) on each of the inner upper walls of trough 27 to prevent the fixing bracket 4 from sliding down when the fixing bracket 4 is inserted. the receptacle stand 3 is placed within the isolation trough 11 of the cast bottom and the isolation trough 21 of the cast top 2. The fixing bracket 4 is in the shape of a letter L and is inserted into the U-shaped recess trough 27 of the cast top 2 and the inserting groove 14 of the cast bottom 1 with its rimplate 41 (see FIG. 2). The receptacle 5 is inserted into the hole of the fixing bracket 4 and is fixed with a locking washer 55 and a nut 56. The transformer 6 is to be installed in the trough stand 15 of the cast bottom 1 and is fixed by the four setting plates 16 and surrounded and adhered to by resin poured in through receptacle 5.

Figure 2:
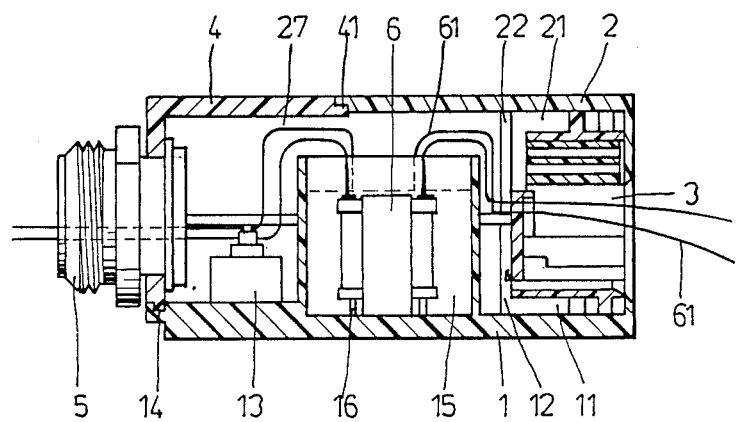
FIG. 2 is a cross-sectional view of the present invention as assembled.

FIG. 2 is a cross-sectional view of the present invention according to FIG. 2. The transformer 6 is installed in the trough stand 15 and is surrounded and adhered to by resin (the portion under the dotted line represents the transformer 6 that has been surrounded by resin and the terminals 61 were left uncoated.) Two wires are led from the receptacle stand 3 through the transformer 6 and the two connection cylinders 13 to the receptacle 5. The fixing bracket 4 is inserted into the cast bottom 1 and cast top 2 and is filled up to the indentation of the cast top 2 and the cast bottom 1. The receptacle stand 3 is installed within the two isolation troughs 11 and 21. The cast bottom 1 and cast top 2 are combined together and preferably form a substantially cubical figure.

Figure 3:
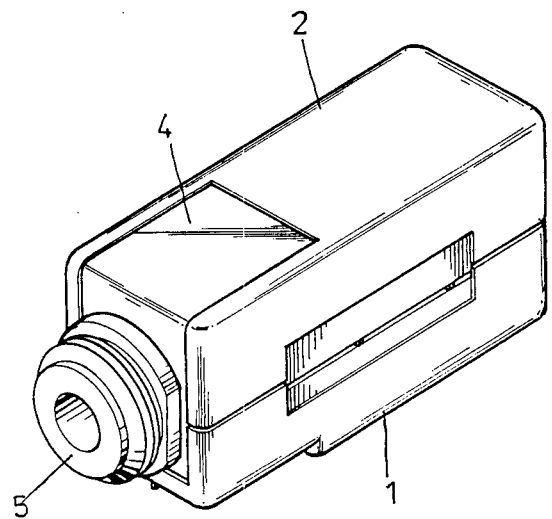
FIG. 3 is a perspective view of the present invention as assembled.

FIG. 3 shows a perspective view of the present invention with the receptacle 5 aligned with the longest side of the converter.

Figure 4:
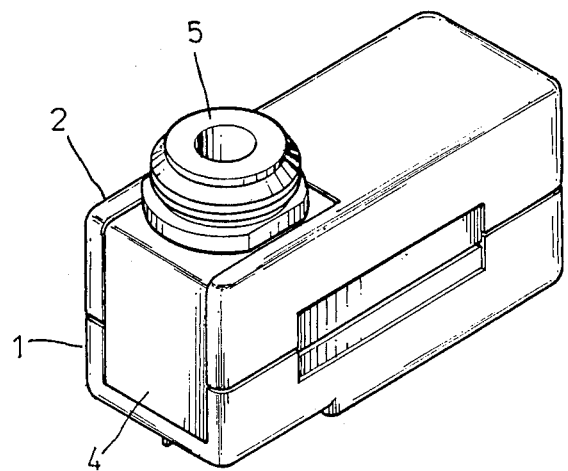
FIG. 4 is a perspective view another embodiment of the present invention in which the receptacle makes an angle of 90 degrees with the cast elements.

FIG. 4 shows another embodiment in which the receptacle 5 of the present invention is aligned in a direction at an angle of b 90 degrees with the longest side of the converter.

Figure 5:
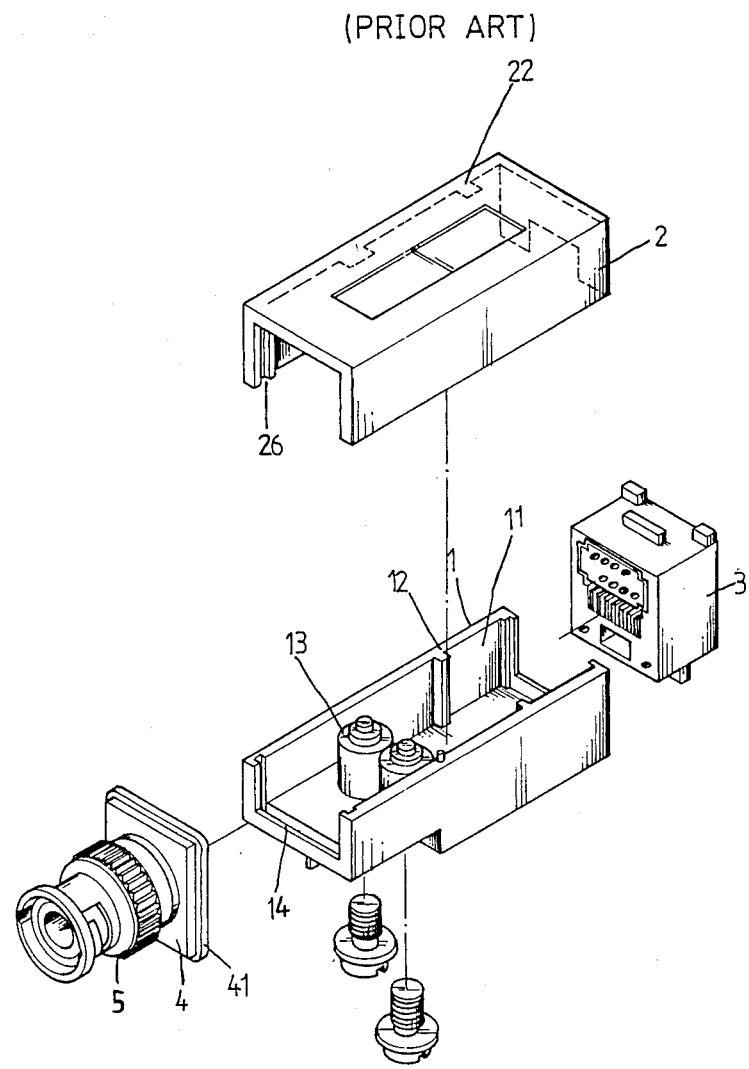
FIG. 5 shows an exploded perspective view of a device of prior art.

FIG. 5 shows an exploded perspective view of an example of the prior art. It can be seen that the cast bottom 1 has no trough stand 15 as the present invention does and, therefore, when resin is poured in, it will flow randomly and will surround and adhere to the receptacle stand 3, the two connection cylinders 13 and the receptacle stand.

Figure 6:
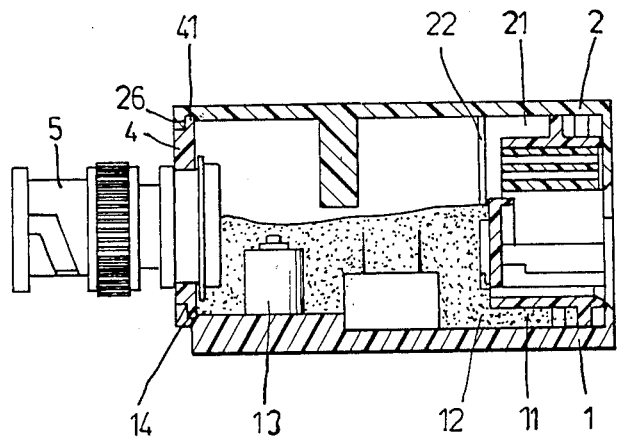
FIG. 6 shows a cross-sectional view of the prior art device of FIG. 5.

FIG. 6 is a cross-section view of the prior art. The dotted portion of the lower part of the converter represents a region filled in and adhered to by resin. Since the receptacle stand 3, the two connection cylinders 13, the transformer 6, the receptacle stand 3 and wires are all covered with and adhered to by resin it is difficult in repair or replace elements that are out of order. Note that the cast top 2 of the prior art per FIGS. 5 and 6 illustrates a groove 26 (similar to groove 14 in cast bottom 1) and internal ribs 22 and 25 at each vertical side.

While there have been described and illustrated several specific embodiments of the invention, it will be clear that variations in the details of the embodiments specifically illustrated and described may be made without departing from the true spirit and scope of the invention as defined in the appended claims.

I claim:

1. A converter, comprising:
 a cast bottom, having an isolation trough defined in part by two vertical ribs, a trough stand, two connection cylinders and an inserting groove at one end, said isolation trough being formed to accommodate a receptacle stand, said isolation trough being separated by the two ribs from the trough stand wherein a transformer is mountable to four setting plates located at the inner bottom of the trough stand for holding the transformer tightly, said two connection cylinders enabling outer connection of the transformer, and said inserting groove enabling the insertion of a fixing bracket to fix the converter;
 a cast top having an isolation trough for covering an upper portion of a receptacle stand when one is installed in the isolation trough of said case bottom and a U-shaped recess trough with two setting points on each wall for preventing said fixing bracket from sliding down when inserted thereinto;
 a receptacle stand installed within the isolation troughs of the cast bottom and the cast top, respectively;
 said fixing bracket having a rim plate for insertion into said inserting groove formed in said cast bottom and a groove providd in the U-shaped recess trough of the cast top, said fixing bracket being formed to receive a receptacle for attachment thereto; and
 a receptacle mounted in selected alignment with respect to said fixing bracket and fixed thereto, preferably with a locking washer and a nut, said receptacle and said isolation troughs coacting so that when resin is poured into the trough stand of the cast bottom it will not flow randomly but will be confined by the walls of the trough stand to enable said resin to set around and under said transformer to hold said transformer in place, whereby the receptacle, the two connection cylinders, the transformer, the receptacle stand and any connecting wires will not be surrounded by nor adhered to by said poured in resin.

* * * * *